United States Patent
Ichinose et al.

(10) Patent No.: US 10,522,460 B2
(45) Date of Patent: Dec. 31, 2019

(54) MEMORY DEVICE AND METHOD FOR MANUFACTURING SAME

(71) Applicant: Toshiba Memory Corporation, Minato-ku (JP)

(72) Inventors: Daigo Ichinose, Nagoya (JP); Shigehiro Yamakita, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/855,186

(22) Filed: Dec. 27, 2017

(65) Prior Publication Data

US 2019/0088586 A1 Mar. 21, 2019

(30) Foreign Application Priority Data

Sep. 15, 2017 (JP) .................................. 2017-178309

(51) Int. Cl.
| | |
|---|---|
| H01L 23/528 | (2006.01) |
| H01L 21/768 | (2006.01) |
| H01L 23/535 | (2006.01) |
| H01L 27/11582 | (2017.01) |
| H01L 49/02 | (2006.01) |

(52) U.S. Cl.
CPC ...... *H01L 23/528* (2013.01); *H01L 21/76805* (2013.01); *H01L 21/76877* (2013.01); *H01L 23/535* (2013.01); *H01L 27/11582* (2013.01); *H01L 28/20* (2013.01)

(58) Field of Classification Search
None
See application file for complete search history.

(56) References Cited

U.S. PATENT DOCUMENTS

| | | | |
|---|---|---|---|
| 8,178,861 B2 | 5/2012 | Futatsuyama | |
| 2008/0099819 A1* | 5/2008 | Kito | ........................ G11C 16/10 257/315 |
| 2011/0019480 A1* | 1/2011 | Kito | .................. H01L 27/11565 365/185.18 |
| 2011/0073866 A1 | 3/2011 | Kim et al. | |
| 2011/0284947 A1* | 11/2011 | Kito | ..................... H01L 21/8221 257/324 |
| 2016/0141337 A1* | 5/2016 | Shimabukuro | ..... H01L 27/2481 365/51 |
| 2018/0247951 A1 | 8/2018 | Fujii et al. | |

* cited by examiner

*Primary Examiner* — Khaja Ahmad
(74) *Attorney, Agent, or Firm* — Oblon, McClelland, Maier & Neustadt, L.L.P.

(57) ABSTRACT

A memory device includes a first conductive layer; a second conductive layer provided above the first conductive layer; a plurality of electrode layers stacked above the second conductive layer; a semiconductor pillar extending through the plurality of electrode layers and the second conductive layer, and connected to the first conductive layer; and a third conductive layer provided above the first conductive layer. The third conductive layer is positioned at a level substantially same as a level of the second conductive layer in an extension direction of the semiconductor pillar, and is made of a material same as a material of the second conductive layer. The third conductive layer is electrically isolated from the second conductive layer, and is electrically connected to the first conductive layer.

13 Claims, 14 Drawing Sheets

MEMORY DEVICE AND METHOD FOR MANUFACTURING SAME

CROSS-REFERENCE TO RELATED APPLICATIONS

This application is based upon and claims the benefit of priority from Japanese Patent Application No. 2017-178309, filed on Sep. 15, 2017; the entire contents of which are incorporated herein by reference.

FIELD

Embodiments generally relate to a memory device and a method for manufacturing the same.

BACKGROUND

A memory device is developed to increase the memory capacity, in which a memory cell array is disposed above a circuit. A NAND memory device in which memory cells are arranged three-dimensionally includes, for example, a plate-shaped conductive layer provided above a circuit, multiple electrode layers stacked above the conductive layer, and semiconductor pillars extending through the multiple electrode layers. In such a memory device, there is a demand for manufacturing technology capable of stably forming holes with high aspect ratio to provide the semiconductor pillars therein.

DETAILED DESCRIPTION

Figure 1:
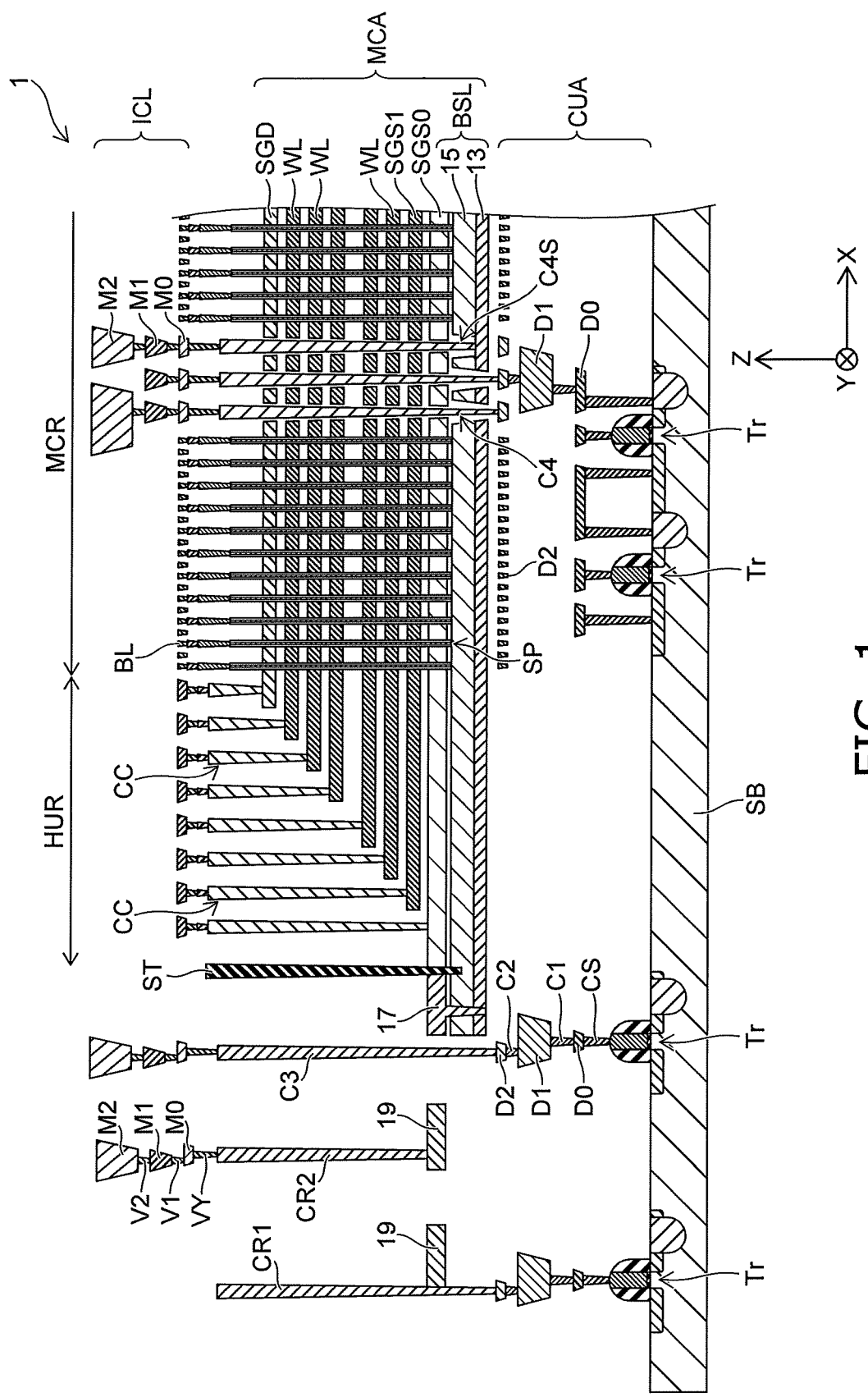
FIG. 1 is a schematic cross-sectional view showing a memory device according to a first embodiment.

According to one embodiment, a memory device includes a first conductive layer; a second conductive layer provided above the first conductive layer; a plurality of electrode layers stacked above the second conductive layer; a semiconductor pillar extending through the plurality of electrode layers and the second conductive layer, and connected to the first conductive layer; and a third conductive layer provided above the first conductive layer, the third conductive layer being positioned at a level substantially same as a level of the second conductive layer in an extension direction of the semiconductor pillar, and being made of a material same as a material of the second conductive layer. The third conductive layer is electrically isolated from the second conductive layer, and is electrically connected to the first conductive layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a memory device 1 according to a first embodiment. The memory device 1 is, for example, a NAND flash memory device and includes a drive circuit CUA and a memory cell array MCA. The memory cell array MCA includes memory cells that are three-dimensionally arranged. The memory cell array MCA is provided above the drive circuit CUA. In FIG. 1, the insulating films that electrically insulate between the components are not illustrated for simplification.

The drive circuit CUA includes multiple circuit elements, e.g., transistors Tr, provided on a substrate SB. The drive circuit CUA further includes interconnections D0, D1, and D2 and contact plugs CS, C1, and C2 that are positioned between the substrate SB and the memory cell array MCA. The contact plug CS electrically connects a transistor Tr and an interconnection D0; the contact plug C1 electrically connects interconnections D0 and D1; and the contact plug C2 electrically connects interconnections D1 and D2.

The memory cell array MCA includes a memory cell region MCR and a hook-up region HUR. The memory cell region MCR includes multiple memory cells that are three-dimensionally arranged. The memory cell array MCA includes a source line BSL, multiple electrode layers that are stacked above the source line BSL, and semiconductor pillars SP. The source line BSL has a structure in which a metal layer 13 and a semiconductor layer 15 are stacked in a Z-direction.

The electrode layers include, for example, a selection gate SGS0, a selection gate SGS1, word lines WL, and a selection gate SGD. The selection gates SGS0 and SGS1, the word lines WL, and the selection gate SGD are stacked in order above the source line BSL with inter-layer insulating films (not illustrated) interposed. The selection gate SGS0 is a semiconductor layer, e.g., a polysilicon layer. The selection gate SGS1, the word lines WL, and the selection gate SGD are, for example, metal layers.

As shown in FIG. 1, the semiconductor pillars SP are disposed in the memory cell region MCR, and extend in the Z-direction through the selection gates SGS0, SGS1, the word lines WL, and the selection gate SGD. The memory cells are provided at the portions where the semiconductor pillars SP and the word lines WL cross. The semiconductor pillars SP are connected to the source line BSL at the bottom ends thereof.

The memory device 1 further includes multi-layer interconnections ICL provided above the memory cell array MCA. The multi-layer interconnections ICL include interconnections M0, M1, and M2. Contact plugs V1 connects an interconnection M0 and an interconnection M1; and contact plug V2 connects an interconnect M1 and an interconnection M2. Contact plugs VY also are provided to connect the interconnections M0 and contact plugs positioned below the interconnections M0.

The interconnections M0 include bit lines BL electrically connected to the top ends of the semiconductor pillars SP. The bit lines BL are provided above the memory cell region MCR and extend in, for example, a Y-direction. The bit lines BL are connected to the top ends of the semiconductor pillars SP via the contact plugs VY, for example.

The selection gates SGS0, SGS1, the word lines WL, and the selection gate SGD have end portions positioned in the hook-up region HUR, respectively, and the end portions are formed in a staircase configuration. Multiple contact plugs CC are provided in the hook-up region HUR and are connected respectively to the end portions of the selection gates SGS0, SGS1, the word lines WL, and the selection gate SGD. The contact plugs CC electrically connect the selection gates SGS0, SGS1, the word lines WL, and the selection gate SGD to the interconnections M0.

The memory device 1 further includes contact plugs C3, C4, and C4S. A contact plug C3 electrically connects an interconnection D2 of the drive circuit CUA to an interconnection M0. A contact plug C4 extends through the memory cell array MCA and electrically connects an interconnection D2 of the drive circuit CUA to an interconnection M0. The contact plug C4S extends through the selection gate SGD, the word lines WL, the selection gates SGS1 and SGS0, and is connected to the source line BSL. The contact plug C4S electrically connects the source line BSL to an interconnection M0.

In the memory device 1, the memory cell array MCA and the drive circuit CUA are electrically connected via the contact plugs C3, C4, and C4S and the multi-later interconnections ICL provided above the memory cell array MCA.

The memory device 1 further includes resistors 19 and a semiconductor layer 17 provided at the periphery of the memory cell array MCA. The semiconductor layer 17 is positioned above an end of the source line BSL, and is electrically connected to the source line BSL. The semiconductor layer 17 is positioned at a level in the Z-direction substantially same as the selection gate SGS0, and includes the same semiconductor material as the selection gate SGS0. In other words, the semiconductor layer 17 is a portion of the selection gate SGS0 divided by a slit ST.

For example, a resistor 19 is electrically connected to an interconnection D2 of the drive circuit CUA via a contact plug CR1. Also, another resistor 19 is electrically connected to an interconnection M0, for example, via a contact plug CR2, and is further electrically connected to an interconnection D2 of the drive circuit CUA via the multi-layer interconnections ICL and a contact plug C3. In other words, the resistors 19 act as circuit elements of the drive circuit CUA.

The resistors 19 are positioned at a level in the Z-direction substantially same as the selection gate SGS0, and includes the same semiconductor material as the selection gate SGS0. Thus, by disposing the resistors 19 above the drive circuit CUA, the chip surface of the memory device 1 is utilized effectively; and, for example, the layout of the drive circuit CUA can have high degree of flexibility.

Figure 2A:
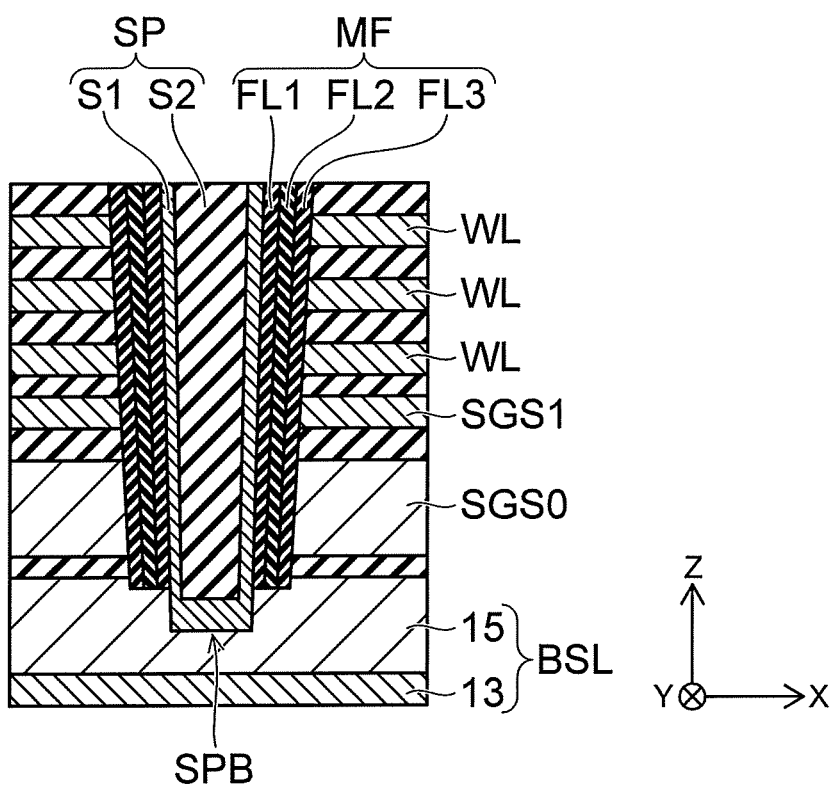
FIGS. 2A and 2B are partial cross-sectional views showing the memory device according to the first embodiment.
Figure 2B:
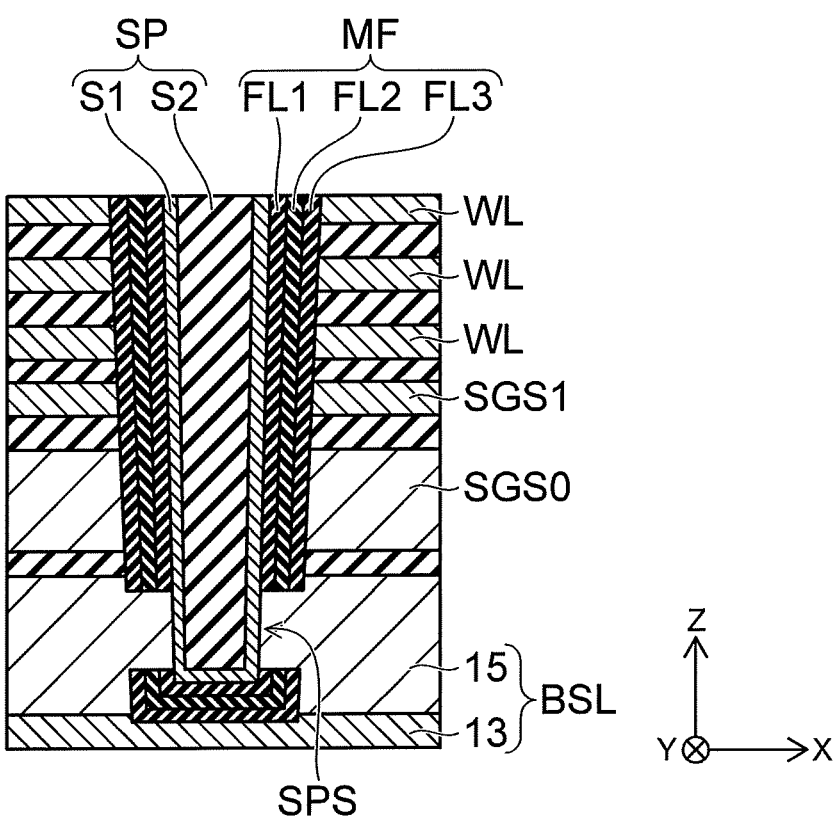

FIGS. 2A and 2B are partial cross-sectional views schematically showing the memory device 1. FIGS. 2A and 2B are schematic views showing the structure of the bottom portion of the semiconductor pillar SP. The semiconductor pillar SP includes a semiconductor layer S1 and an insulative core S2. The insulative core S2 includes, for example, silicon oxide, and extends in the Z-direction. The semiconductor layer S1 is, for example, a polycrystalline silicon layer, and is provided to cover the insulative core S2. A memory film MF is further provided between the semiconductor pillar SP and the word lines WL. The memory film MF covers the side surface of the semiconductor pillar SP, and extends in the Z-direction along the semiconductor pillar SP.

For example, the memory film MF has a structure in which a tunneling insulator film FL1, a charge storage film FL2, and a blocking insulator film FL3 are stacked, and has the function of retaining charges. For example, the tunneling insulator film FL1 and the blocking insulator film FL3 are silicon oxide films; and the charge storage film FL2 is a silicon nitride film.

As shown in FIG. 2A, the semiconductor pillar SP is connected to the source line BSL at a bottom end SPB of the semiconductor pillar SP. For example, the semiconductor layer S1 of the semiconductor pillar SP contacts the semiconductor layer 15 of the source line BSL. Thereby, it is possible to reduce the contact resistance between the semiconductor pillar SP and the source line BSL. As shown in FIG. 2B, a structure may be used in which a side surface SPS of the bottom end portion of the semiconductor pillar SP contacts the semiconductor layer 15 of the source line BSL.

Figure 3A:
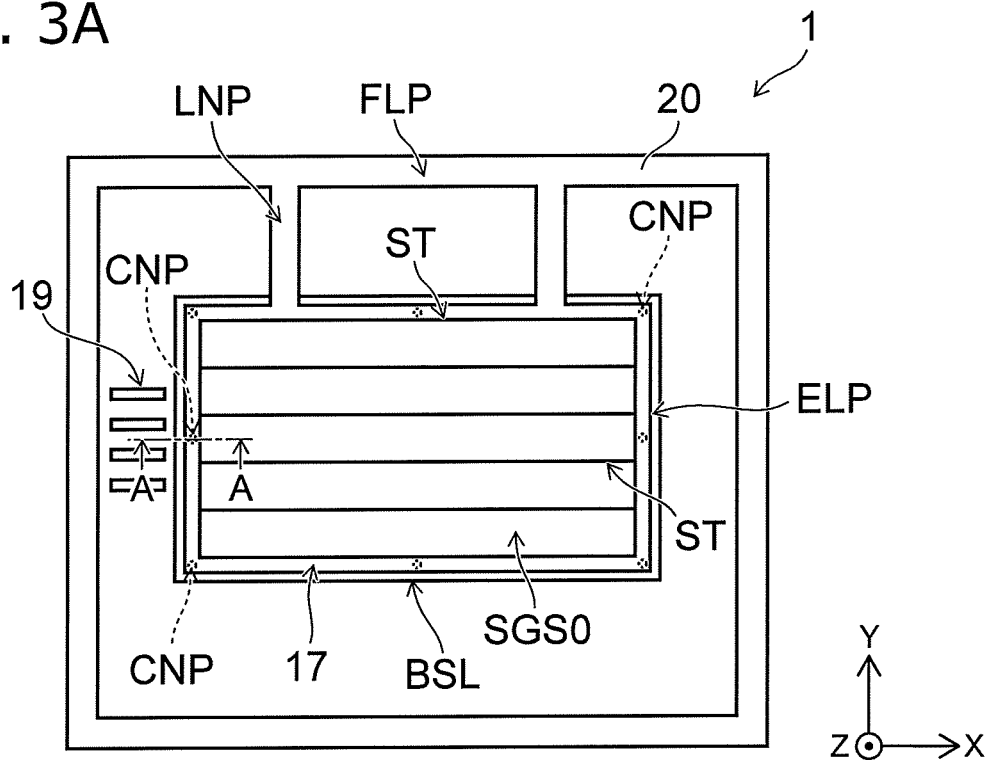
FIGS. 3A and 3B are schematic plan views showing the memory device according to the first embodiment.
Figure 3B:
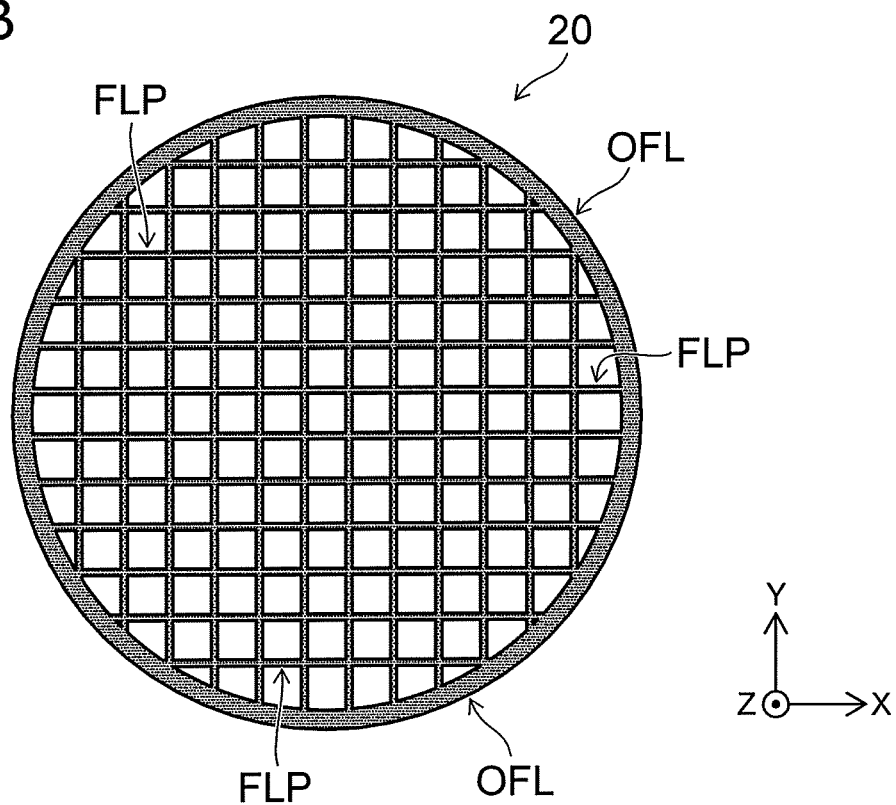

FIGS. 3A and 3B are schematic plan views showing the memory device 1 according to the first embodiment. FIG. 3A is a plan view showing the source line BSL, the resistor 19, and a semiconductor layer 20 to clarify the positional relationship thereof. FIG. 3B is a schematic view showing the semiconductor layer 20 provided on the substrate SB in the wafer state.

As shown in FIG. 3A, the semiconductor layer 20 includes an element portion ELP, a frame portion FLP, and a link portion LNP. The frame portion FLP is provided to surround the element portion ELP. The link portion LNP links the element portion ELP and the frame portion FLP. The element portion ELP is provided at a position corresponding to the memory cell array MCA; and the frame portion FLP is provided, for example, along a so-called dicing line at the boundary of multiple memory devices 1 provided on the substrate SB.

The element portion ELP is subdivided by the slit ST and includes the selection gate SGS0 and the semiconductor layer 17. More specifically, the selection gate SGS0 is subdivided into the multiple selection gates SGS0 corresponding respectively to multiple blocks (or fingers) provided inside the memory cell array MCA. The semiconductor layer 17 is disposed at the periphery of the multiple selection gates SGS0 while being electrically isolated from the selection gates SGS0 by the slit ST. Here, the semiconductor layer 17 is surrounded with the frame portion FLP, and is positioned on the inner side of the frame portion FLP. The semiconductor layer 17 is disposed in a pattern having a frame-shaped configuration surrounding the multiple selection gates SGS0 inside the memory cell array MCA. For example, the source line BSL is provided in a plate-shaped configuration over the entire region below the element portion ELP of the semiconductor layer 20 without being subdivided for each of the multiple blocks (or fingers).

The semiconductor layer 17 includes multiple short-circuit portions CNP and is electrically connected to the source line BSL. The resistors 19 are disposed in the space between the element portion ELP and the frame portion FLP, and extend, for example, in a direction from the frame portion FLP toward the element portion ELP.

As shown in FIG. 3B, the frame portion FLP is formed as one body over the entire wafer. The frame portion FLP includes an outer perimeter portion OFL provided along the outer edge of the wafer. The element portion ELP and the link portion LNP are not illustrated in FIG. 3B for convenience in sowing the entire frame portion FLP.

A method for manufacturing the memory device 1 will now be described with reference to FIGS. 4A to 7B.

FIGS. 4A to 5A and FIGS. 6A to 7B are schematic cross-sectional views showing manufacturing processes of the memory device according to the first embodiment. FIGS. 4A to 5A and FIGS. 6A to 7B are cross-sectional views along line A-A shown in FIG. 3A. FIG. 5B is a schematic plan view showing a mask pattern.

Figure 4A:
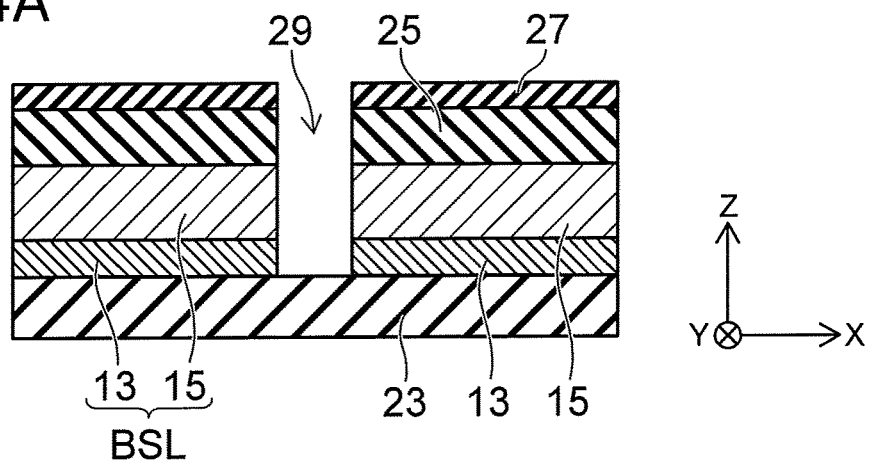
FIGS. 4A to 7B are schematic views showing a manufacturing process of the memory device according to the first embodiment.

As shown in FIG. 4A, a metal layer 13 and a semiconductor layer 15 are formed on an inter-layer insulating film 23. The inter-layer insulating film 23 is, for example, a silicon oxide film, and is provided on the drive circuit CUA. The metal layer 13 is, for example, a tungsten layer; and the semiconductor layer 15 is, for example, a polycrystalline silicon layer.

The source line BSL is formed by patterning the metal layer 13 and the semiconductor layer 15 into a prescribed configuration (see FIG. 3A). Subsequently, an inter-layer insulating film 25 that covers the source line BSL is formed. After forming a hard mask 27, a contact hole 29 is formed by selectively removing the inter-layer insulating film 25, the semiconductor layer 15, and the metal layer 13. For example, the contact hole 29 is formed simultaneously with through-holes provided in the source line BSL for the contact plugs C4 extending therethrough (see FIG. 1).

Figure 4B:
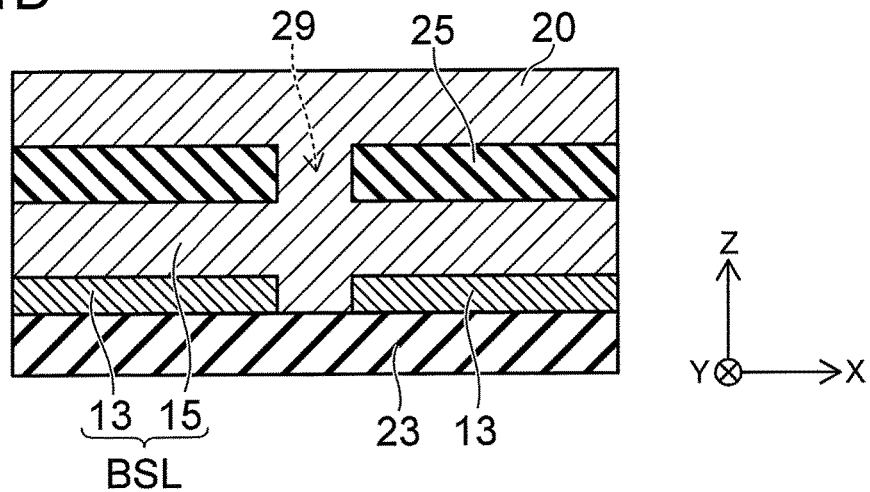

As shown in FIG. 4B, the semiconductor layer 20 is formed on the inter-layer insulating film 25 after removing the hard mask 27. The semiconductor layer 20 is, for example, a conductive polycrystalline silicon layer, and includes a short-circuit portion CNP that fills the interior of the contact hole 29. The short-circuit portion CNP contacts the metal layer 13 and the semiconductor layer 15, and electrically connects the source line BSL and the semiconductor layer 20.

Figure 4C:
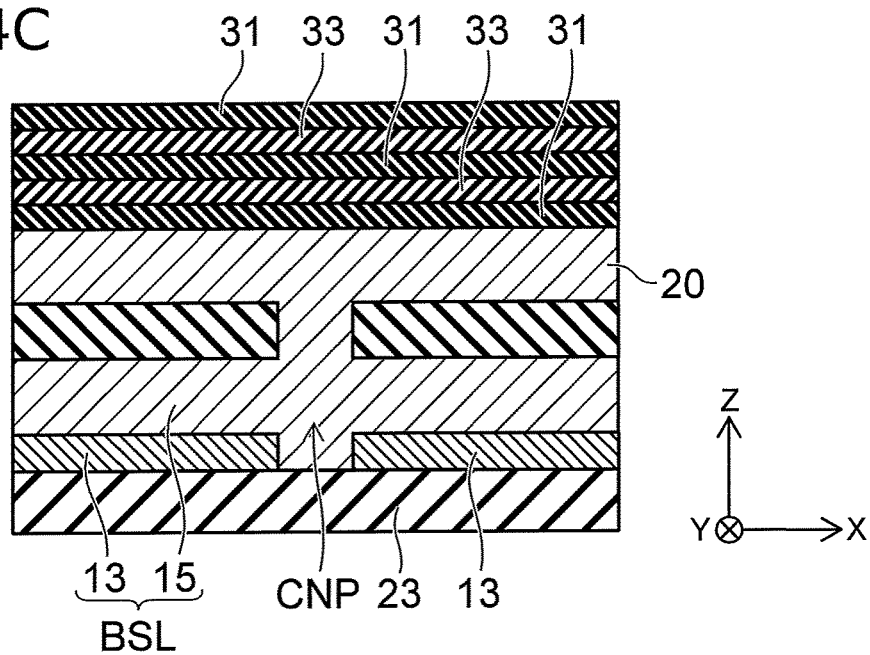

As shown in FIG. 4C, inter-layer insulating films 31 and sacrificial films 33 are stacked alternately on the semiconductor layer 20. The inter-layer insulating film 31 is, for example, a silicon oxide film; and the sacrificial film 33 is, for example, a silicon nitride film.

Figure 5A:
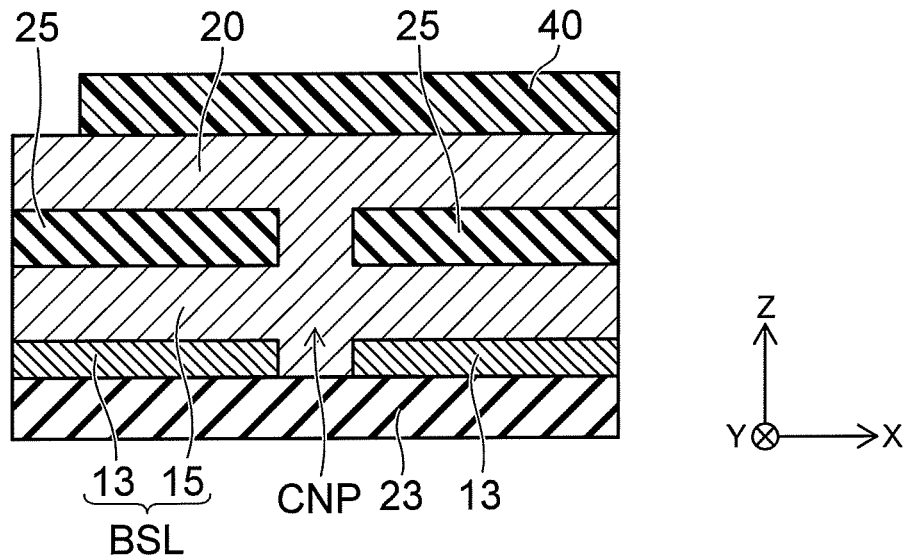

Subsequently, in a not-illustrated portion, the inter-layer insulating films 31 and the sacrificial films 33 are selectively removed to form a stacked body 30 including end portions thereof that are formed into a staircase configuration (see FIG. 6A). The semiconductor layer 20 is exposed at the portion where the inter-layer insulating films 31 and the sacrificial films 33 are selectively removed. As shown in FIG. 5A, an etching mask 40 is formed to cover the semiconductor layer 20 and the stacked body 30 (not illustrated).

Figure 5B:
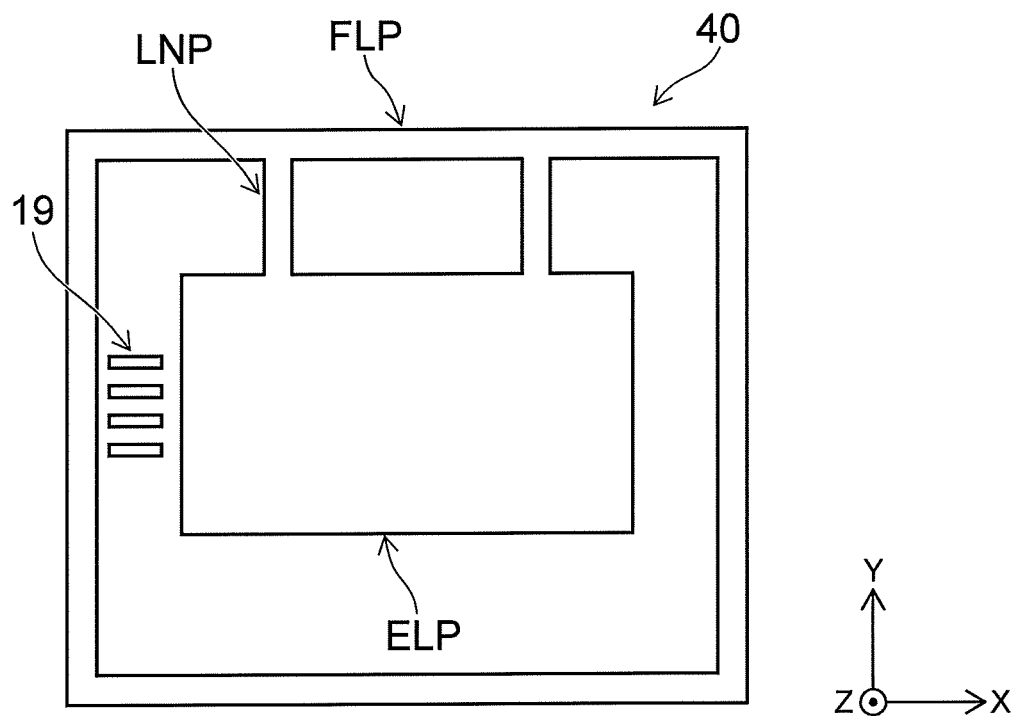

As shown in FIG. 5B, the etching mask 40 includes portions corresponding to the element portion ELP, the frame portion FLP, the link portion LNP, and the resistors 19. Then, the element portion ELP, the frame portion FLP, the link portion LNP, and the resistor 19 are formed by selectively removing the semiconductor layer 20 using the etching mask 40.

Figure 6A:
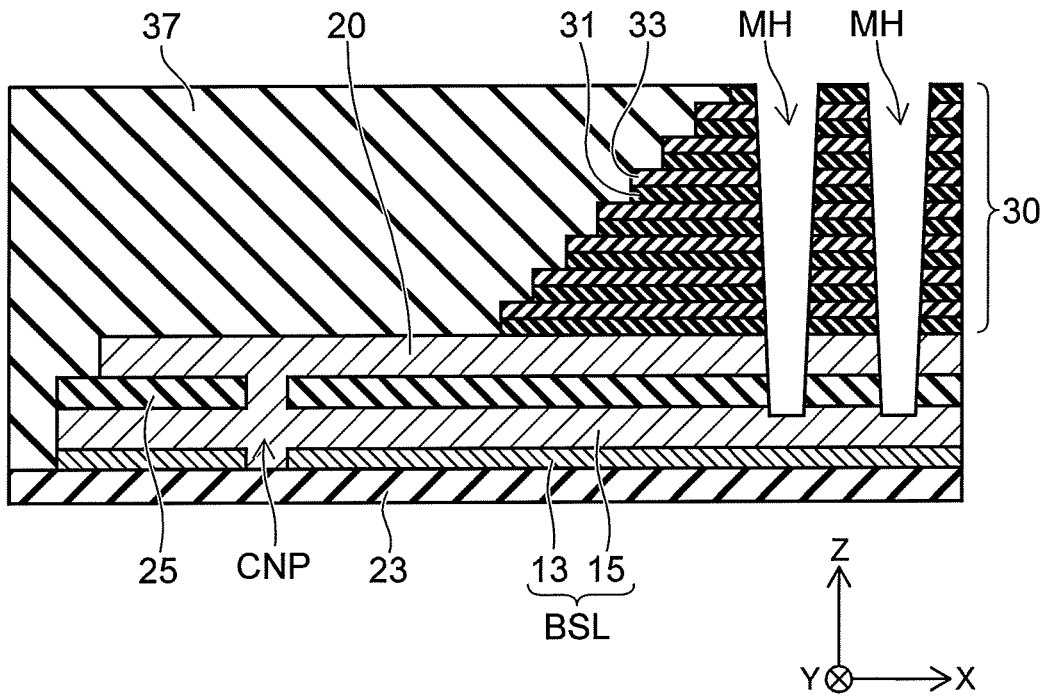

As shown in FIG. 6A, an insulating film 37 is formed to cover the periphery of the stacked body 30 that includes the inter-layer insulating films 31 and the sacrificial films 33. For example, the top surface of the insulating film 37 is planarized to be positioned at a level substantially same as the top surface of the stacked body 30. Subsequently, memory holes MH are formed from the top surface of the stacked body 30 so as to extend through the stacked body 30 and reach the source line BSL. Then, the etching of the memory holes MH is performed under the condition where the etching rates of the inter-layer insulating films 31 and the sacrificial films 33 are high with respect to the semiconductor layer 20, and thereby, it is possible to use the semiconductor layer 20 as an etching stopper for aligning the positions of the bottom ends of the memory holes MH.

Figure 6B:
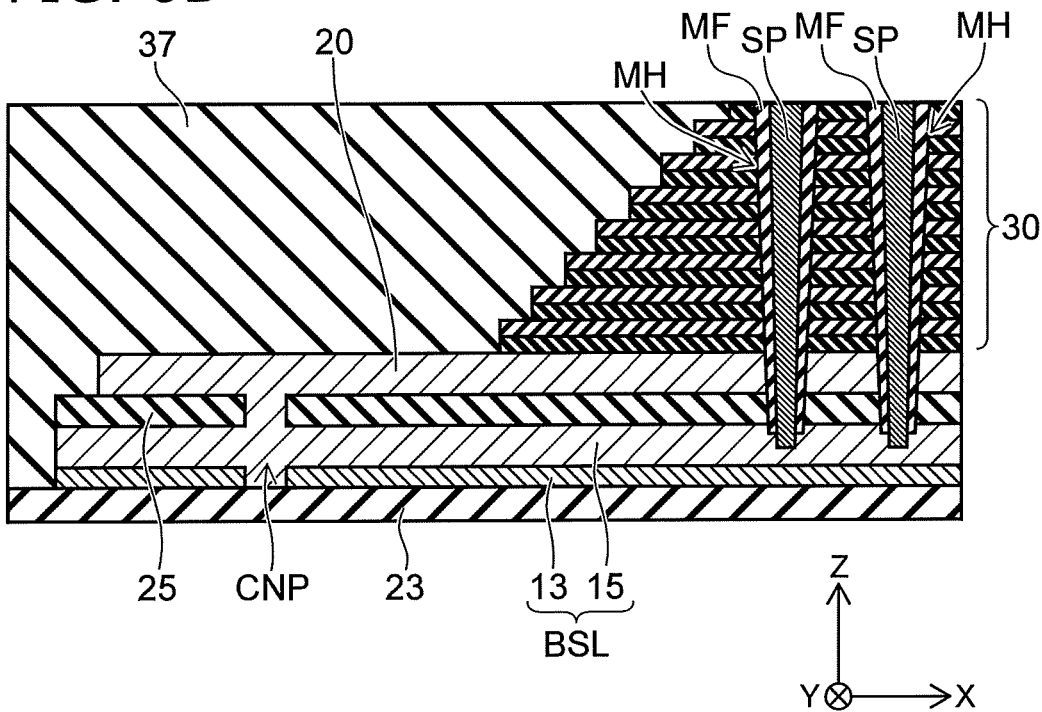

As shown in FIG. 6B, the memory films MF and the semiconductor pillars SP are formed in the memory holes MH. The memory films MF include, for example, multiple insulating films stacked on the inner surfaces of the memory holes MH respectively. The semiconductor pillars SP extend in the extension direction of the memory holes MH (the Z-direction) in the memory holes MH, and are formed so that the bottom ends of the semiconductor pillars SP contact the semiconductor layer 15.

Figure 7A:
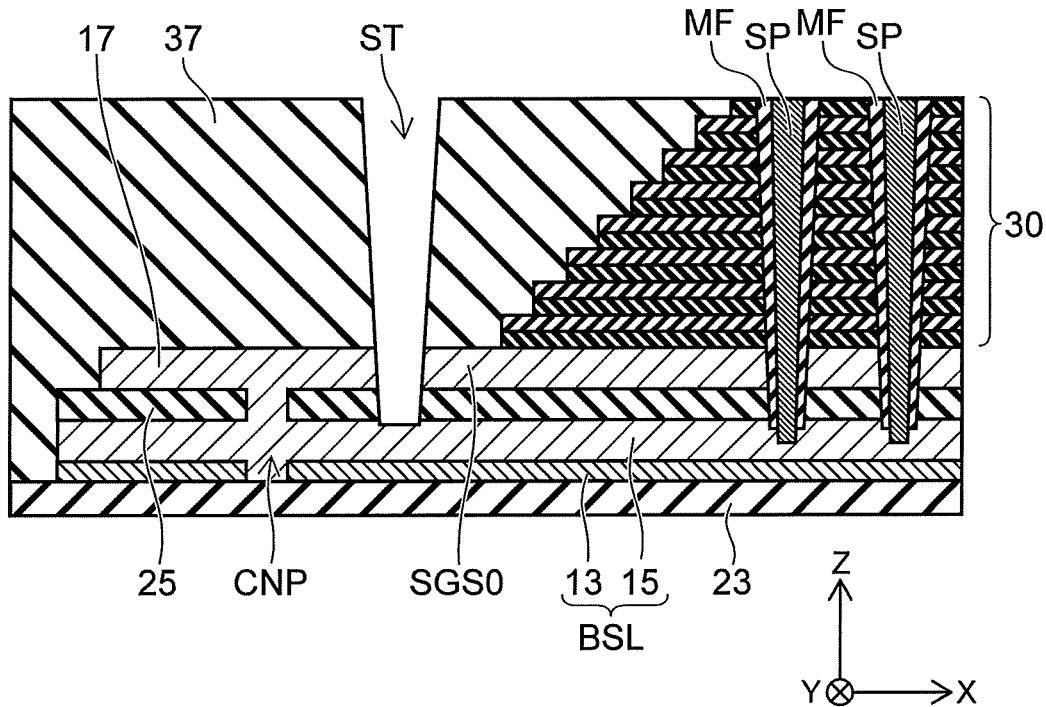

As shown in FIG. 7A, the semiconductor layer 20 is divided by forming the slit ST from the top surface of the insulating film 37 to reach the inter-layer insulating film 25. Thereby, the selection gate SGS0 and the semiconductor layer 17 are formed in the element portion ELP of the semiconductor layer 20 (see FIG. 3A). Then, in the cross section orthogonal to FIG. 7A, the stacked body 30 on the semiconductor layer 20 are divided with the semiconductor layer 20 by the slit ST (see FIG. 3A); and thereby, the semiconductor layer 20 is divided together with the sacrificial films 33 into multiple blocks (or fingers) each including the selection gate SGS0 and parts of the sacrificial films 33 that will be replaced with the selection gate SGS1, the word lines WL, and the selection gate SGD. Subsequently, the sacrificial films 33 are selectively removed via the slit ST.

Figure 7B:
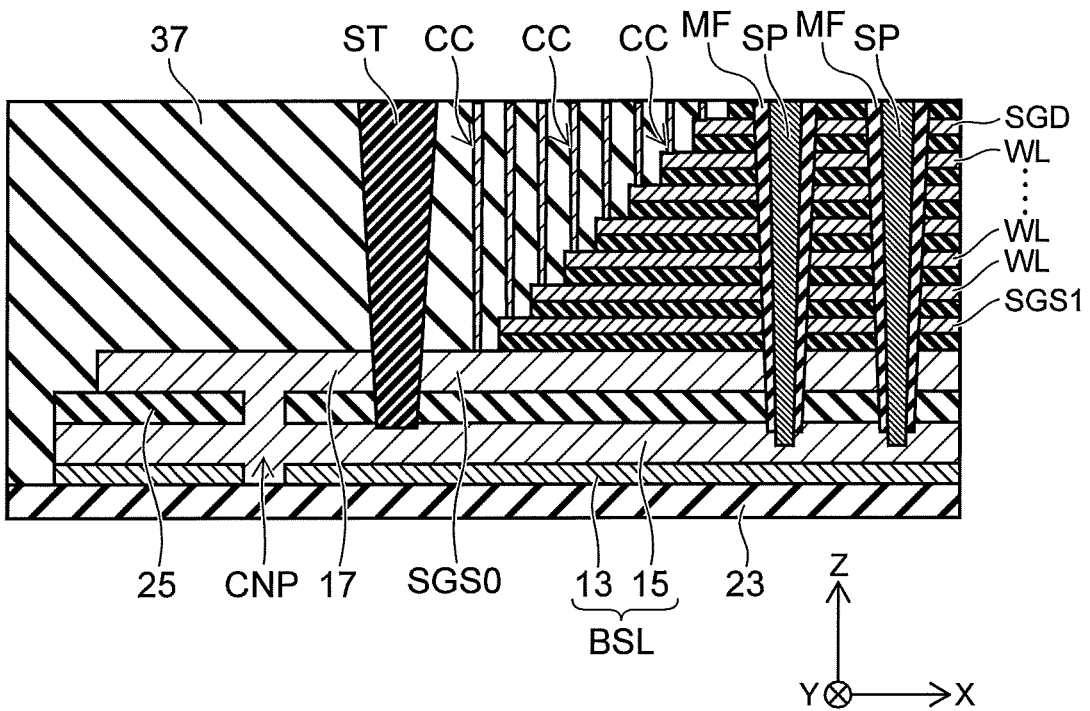

As shown in FIG. 7B, the selection gate SGS1, the word lines WL, and the selection gate SGD are formed by depositing metal films inside the spaces where the sacrificial films 33 are removed. The selection gate SGS1, the word lines WL, and the selection gate SGD are, for example, tungsten films.

An insulating film, e.g., a silicon oxide film, is embedded in the slit ST; subsequently, contact plugs CC are formed to be connected respectively to the end portions of the selection gates SGS0, SGS1, the word lines WL, and the selection gate SGD.

Figure 8A:
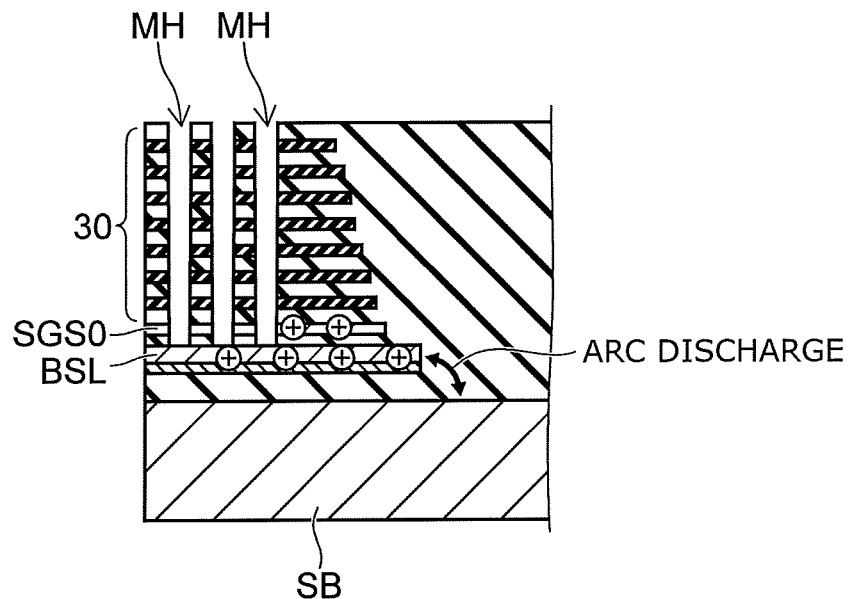
FIGS. 8A and 8B are schematic cross-sectional views showing characteristics of the memory device according to the first embodiment.
Figure 8B:
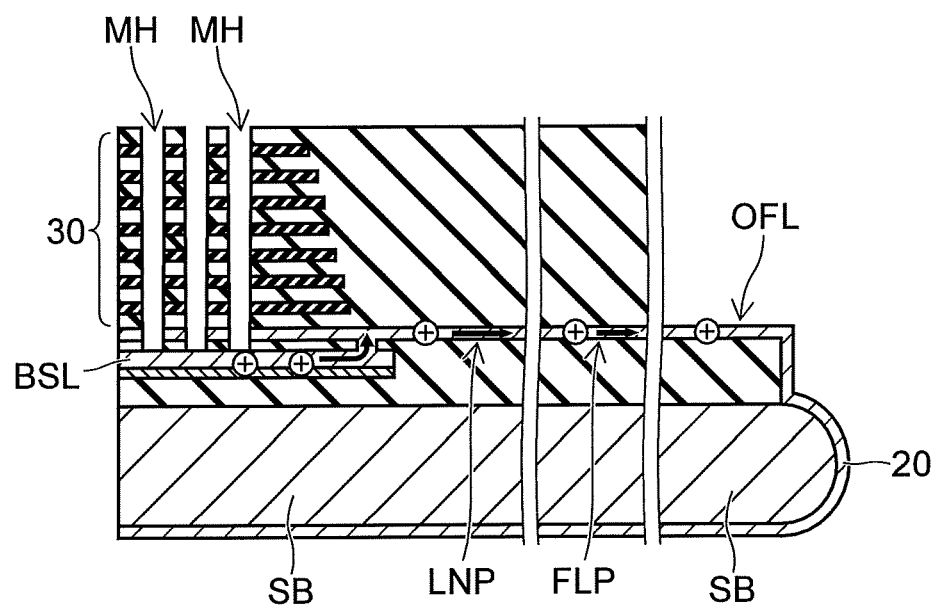

FIGS. 8A and 8B are schematic cross-sectional views showing characteristics of the memory device according to the first embodiment. FIG. 8A is a cross-sectional view showing a method for manufacturing a memory device according to a comparative example; and FIG. 8B is a cross-sectional view showing the method for manufacturing the memory device 1 according to the embodiment.

As shown in FIG. 8A, for example, anisotropic RIE (Reactive Ion Etching) is used in the case where the memory holes MH are formed to extend through the stacked body 30 provided above the source line BSL. At this time, positive charges are supplied from plasma-excited ions to the selection gate SGS0 and the source line BSL which are conductive. If the selection gate SGS0 and the source line BSL are electrically insulated from the region therearound, the positive charges accumulate in the selection gate SGS0 and the source line BSL; and charge buildup occurs in the selection gate SGS0 and the source line BSL. Thereby, arc discharge may occur, for example, between the substrate SB and the source line BSL. A discharge may also occur between plasma inside the RIE apparatus and the source line BSL in which the charges are built up.

In contrast, in the memory device 1 according to the embodiment, the semiconductor layer 20 that is used to form the selection gate SGS0 includes the frame portion FLP that extends over the entire substrate SB of wafer configuration (referring to FIG. 3B). The source line BSL is electrically connected to the semiconductor layer 20. Moreover, the outer perimeter portion OFL of the semiconductor layer 20 is exposed at the outer edge of the substrate SB. Preferably, the semiconductor layer 20 is electrically connected to the substrate SB at the outer perimeter portion OFL. For example, the semiconductor layer 20 and the substrate SB may be electrically connected via the portion of the semiconductor layer 20 which is deposited using CVD (Chemical Vapor Deposition) and remains on the outer side of the outer perimeter portion OFL.

As shown in FIG. 8B, the positive charges that are supplied to the semiconductor layer 20 and the source line BSL via the memory holes MH move to the outer perimeter portion OFL via the link portion LNP and the frame portion FLP. As a result, the positive charges and the negative charges combine at the outer perimeter portion OFL exposed to the plasma; and the charges of the semiconductor layer 20 and the source line BSL can be neutralized. Also, the positive charges may be discharged to the substrate SB via the portion remaining on the outer side of the outer perimeter portion OFL of the semiconductor layer 20.

Thus, in the embodiment, the charge buildup of the selection gate SGS0 (the semiconductor layer 20) and the source line BSL is suppressed; and the arc discharge between the source line BSL and the substrate SB can be avoided. Thereby, for example, damage of the drive circuit CUA can be prevented.

Although in the embodiment recited above shown is an example in which the semiconductor layer 20 includes the frame portion FLP and the link portion LNP, the embodiment is not limited thereto. For example, the source line BSL may include the frame portion FLP and the link portion LNP. This is similar for the embodiments recited below as well.

Second Embodiment

FIGS. 9A to 14 are schematic views showing a method for manufacturing a memory device 2 according to a second embodiment.

Figure 9A:
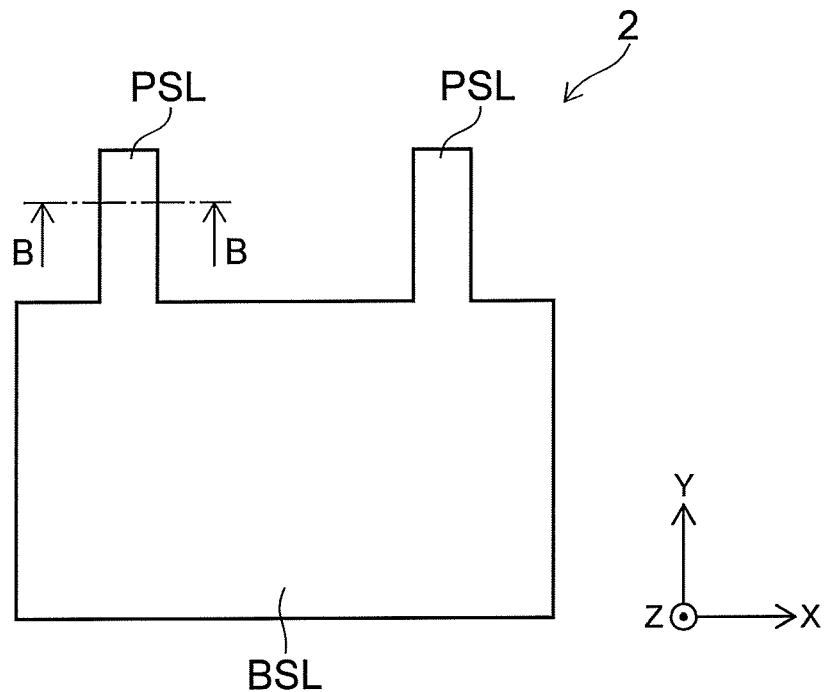
FIGS. 9A to 14 are schematic views showing a manufacturing process of a memory device according to a second embodiment.
Figure 9B:
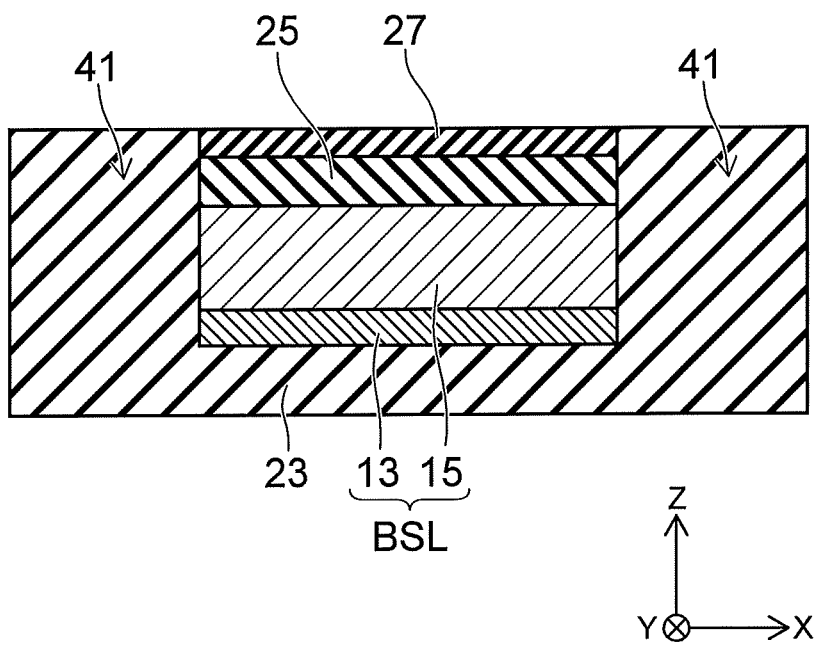
Figure 10A:
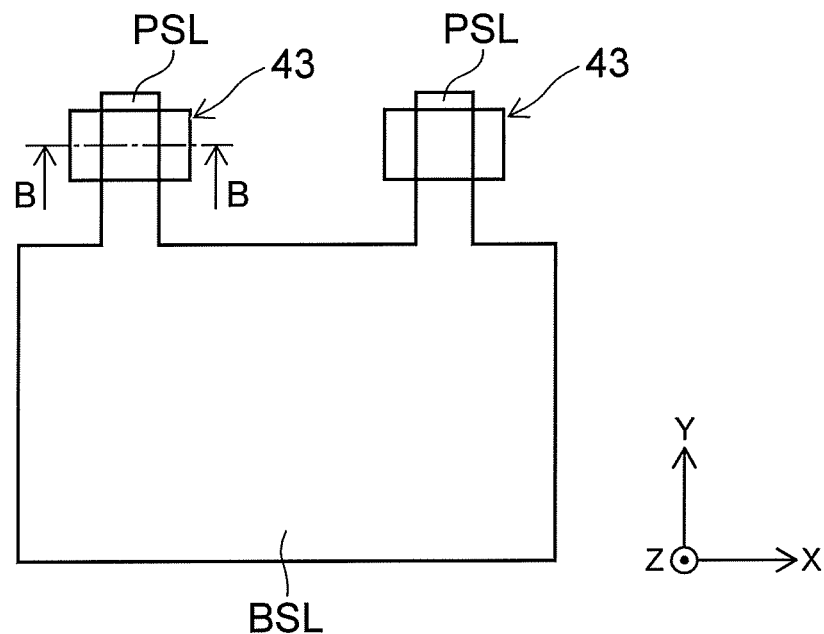
Figure 10B:
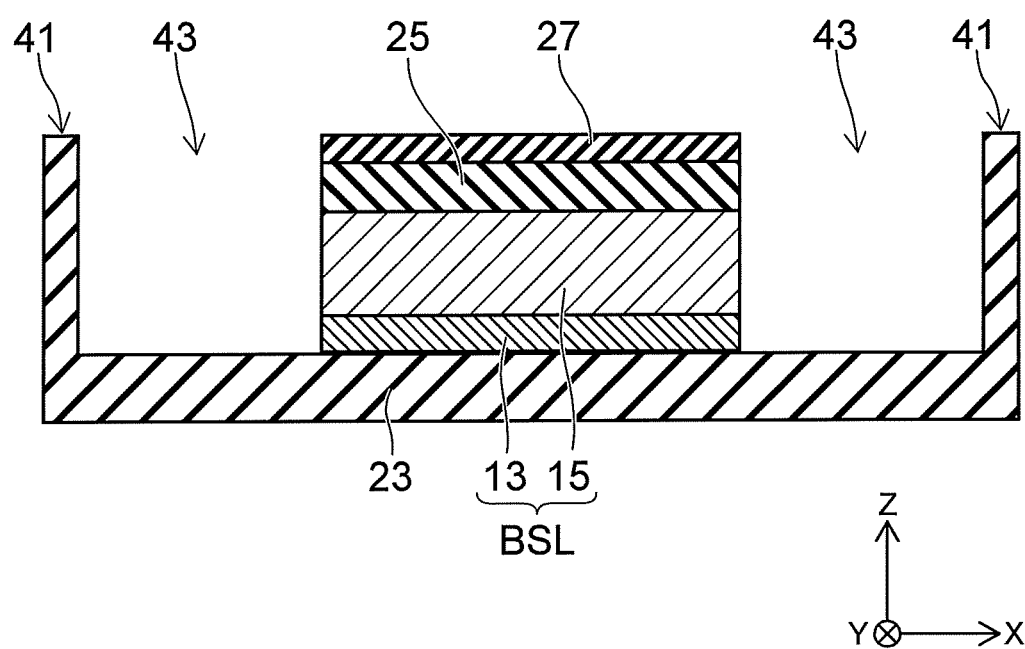
Figure 11A:
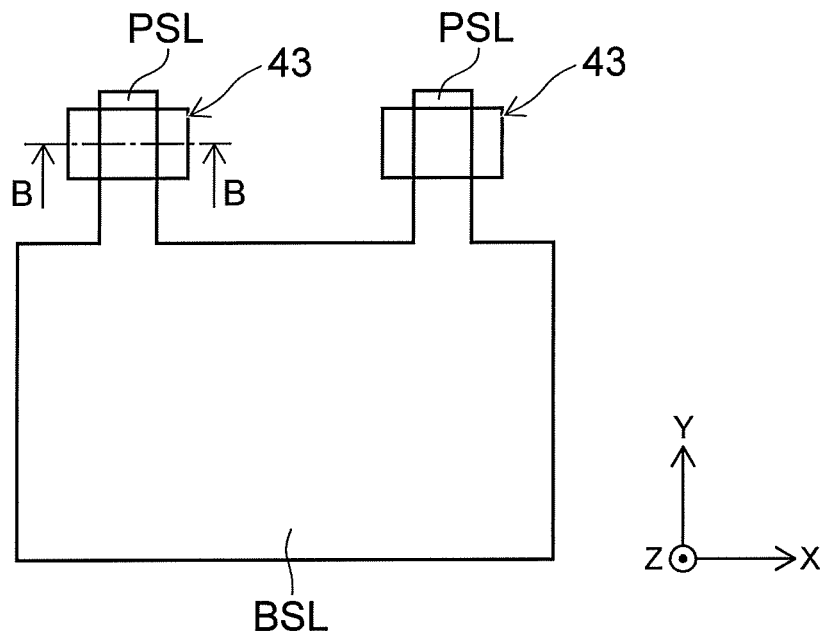
Figure 11B:
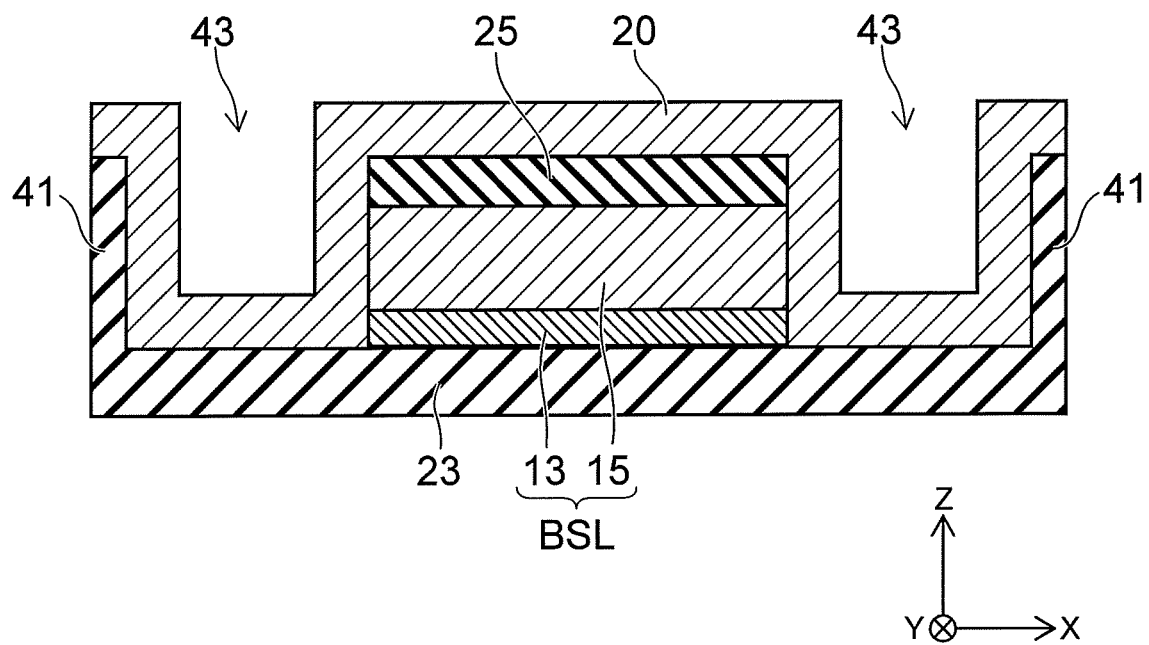

FIG. 9A, FIG. 10A, and FIG. 11A are plan views showing the top surface of the source line BSL; and FIG. 9B, FIG. 10B, and FIG. 11B are cross-sectional views along line B-B shown in FIG. 9A, FIG. 10A, and FIG. 11A.

Figure 12A:
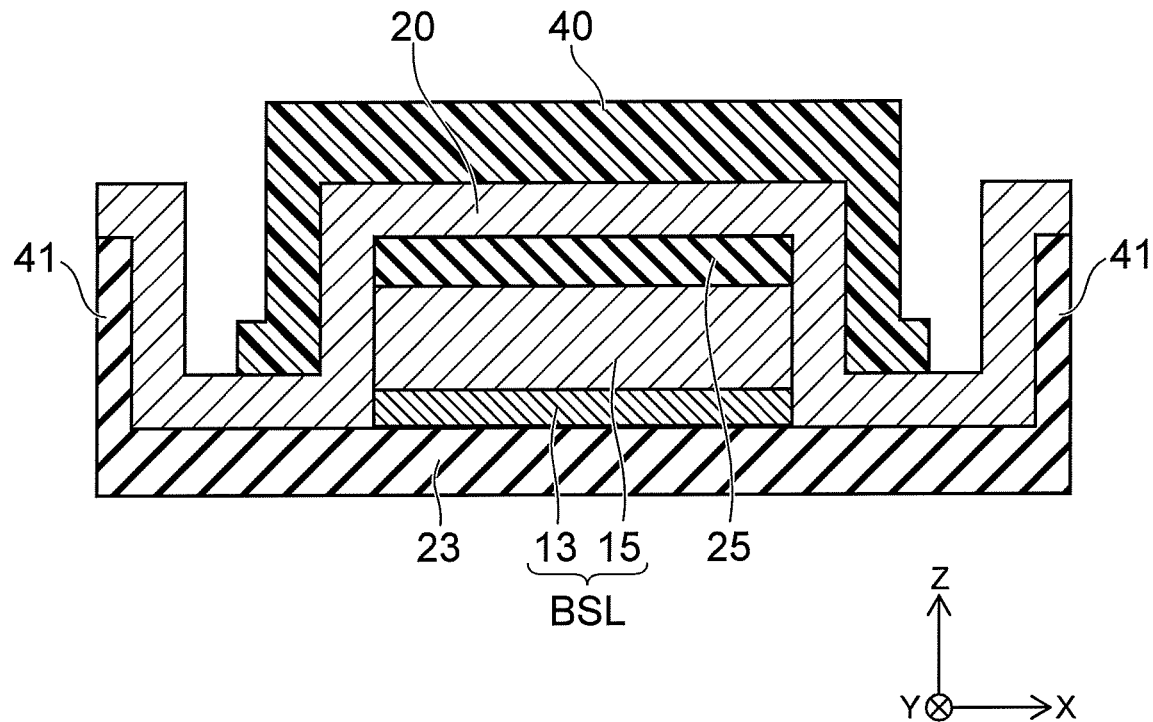
Figure 12B:
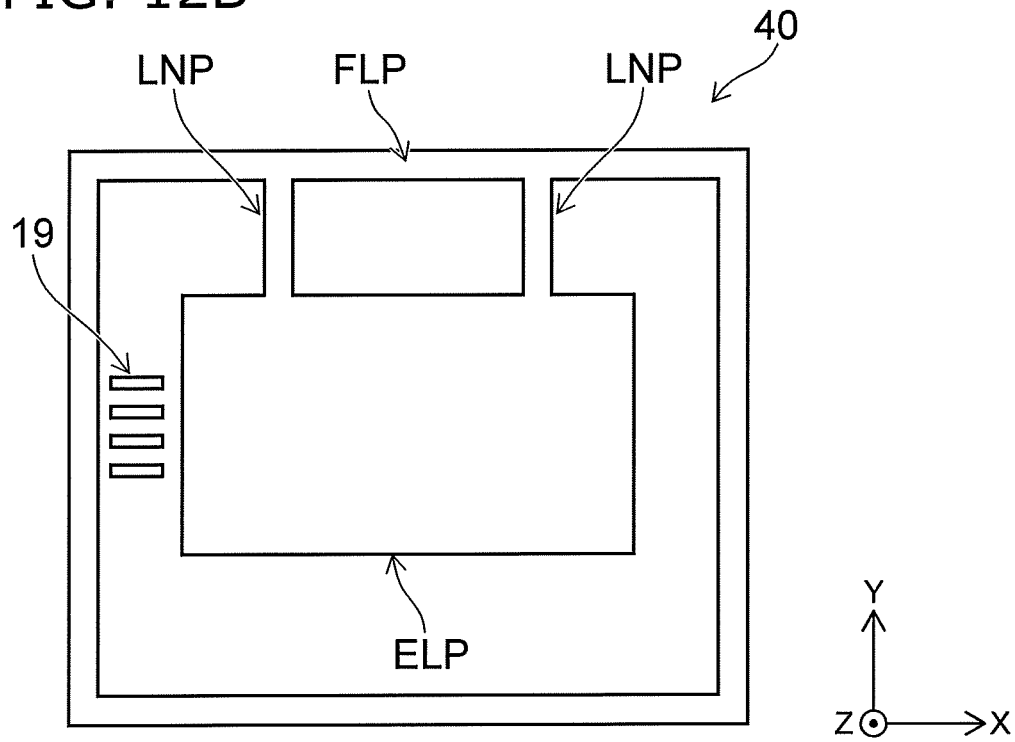
Figure 13:
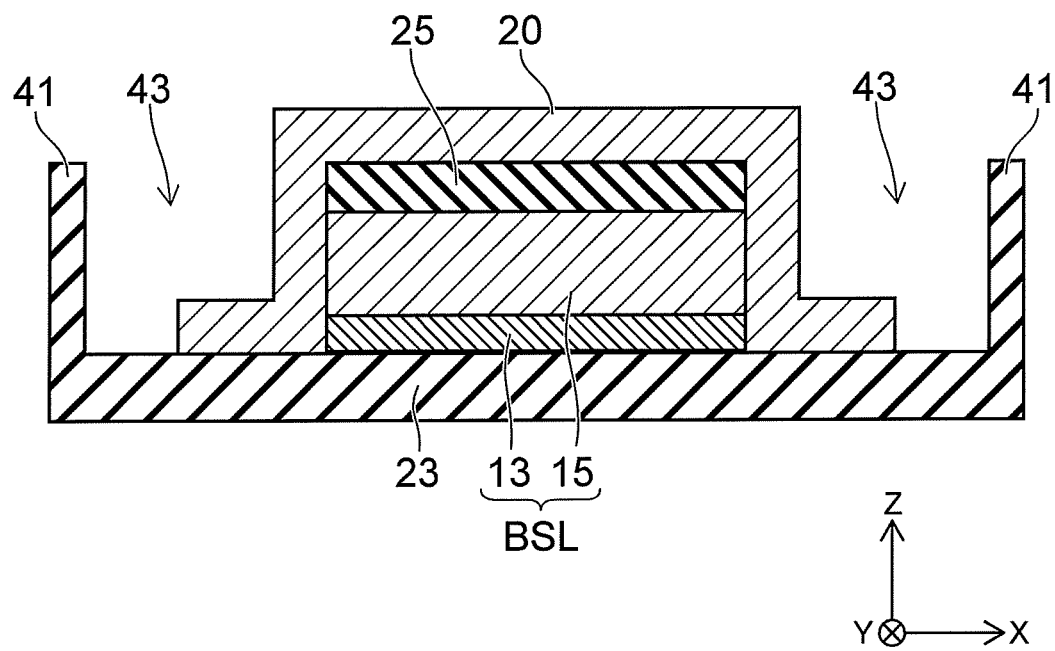
Figure 14:
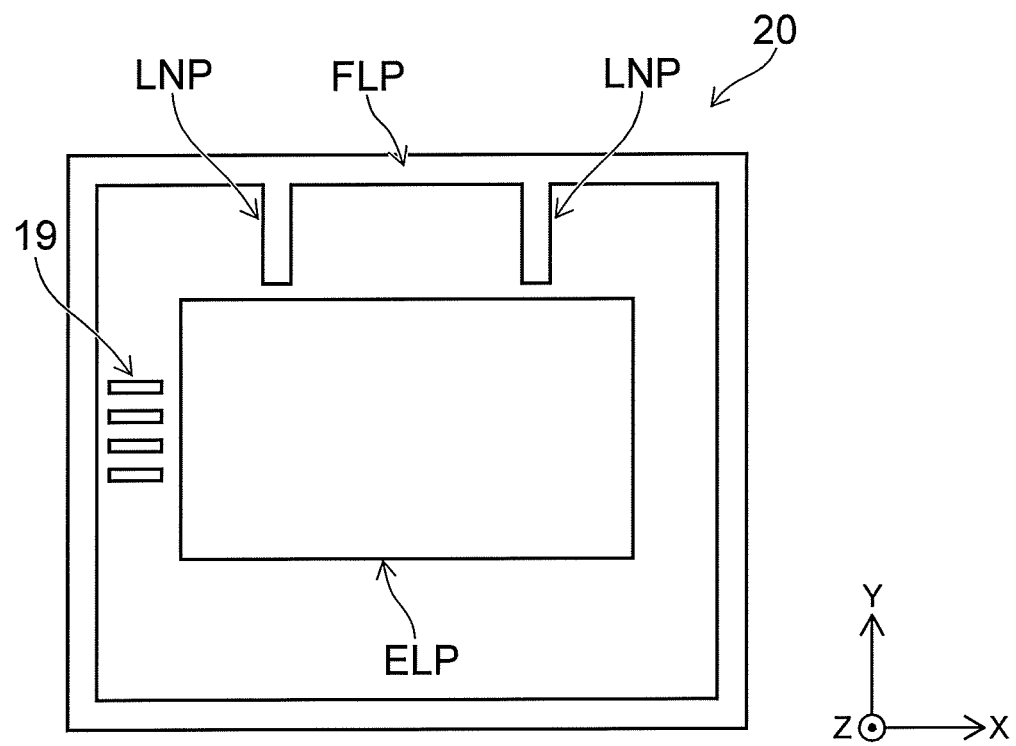

FIG. 12A and FIG. 13 are cross-sectional views along line B-B; and FIG. 12B is a plan view showing the mask pattern provided on the semiconductor layer 20. FIG. 14 is a plan view showing the semiconductor layer 20.

As shown in FIG. 9A, the source line BSL is provided in a configuration including two protruding portions PSL.

As shown in FIG. 9B, the source line BSL includes the metal layer 13 and the semiconductor layer 15. The source line BSL is formed on the inter-layer insulating film 23. The inter-layer insulating film 25 and the hard mask 27 are formed on the source line BSL. The hard mask 27 is, for example, a silicon nitride film, and is formed to pattern the source line BSL into the prescribed configuration (see FIG. 9A).

An insulating film 41 is formed around the source line BSL. The top surface of the insulating film 41 is formed to be positioned in substantially the same plane as the top surface of the hard mask 27 by planarizing using CMP, for example. The insulating film 41 is, for example, a silicon oxide film.

As shown in FIGS. 10A and 10B, openings 43 are formed in the regions where the protruding portions PSL of the source line BSL are positioned. The openings 43 are formed by selectively removing the insulating film 41; and side surfaces of the source line BSL are exposed in the interiors of the openings 43.

As shown in FIGS. 11A and 11B, the semiconductor layer 20 is formed on the inter-layer insulating film 25. The semiconductor layer 20 is formed to contact the side surfaces of the source line BSL in the interiors of the openings 43. Thereby, the semiconductor layer 20 is electrically connected (shorted) to the source line BSL.

As shown in FIGS. 12A and 12B, the etching mask 40 is formed on the semiconductor layer 20. The etching mask 40 includes portions corresponding respectively to the element portion ELP, the frame portion FLP, the link portions LNP, and the resistors 19. The link portions LNP are provided at positions overlapping the protruding portions PSL of the source line BSL when viewed from above.

As shown in FIG. 13, the element portion ELP, the frame portion FLP, the link portions LNP and the resistors 19 are formed by selectively removing the semiconductor layer 20 by using the etching mask 40. The semiconductor layer 20 is electrically connected to the source line BSL by the link portions LNP.

Then, the stacked body 30 that includes the inter-layer insulating films 31 and the sacrificial films 33 is formed on the semiconductor layer 20; and the memory holes MH that reach the source line BSL from the top surface of the stacked body 30 are formed (see FIG. 6A). Subsequently, the memory films MF and the semiconductor pillars SP are formed in the memory holes MH (see FIG. 6B).

As shown in FIG. 14, the semiconductor layer 20 is divided at positions of the link portions LNP proximal to the element portion ELP. Thereby, the source line BSL can be electrically isolated from the selection gate SGS0. The source line BSL also may be divided together with the semiconductor layer 20. In such a case, the portions that short the source line BSL and the semiconductor layer 20 may remain in the protruding portions PSL separated from the source line BSL, and the link portions LNP that overlap each other. Thereafter, the sacrificial films 33 inside the stacked body 30 are replaced with the selection gate SGS1, the word lines WL, and the selection gate SGD via the slit ST; and the contact plugs CC are formed to be connected respectively to the end portions of the selection gates SGS0 and SGS1, the word lines WL, and the selection gate SGD (see FIGS. 7A and 7B).

In the embodiment as well, the charge buildup of the semiconductor layer 20 and the source line BSL can be suppressed in the process of forming the memory holes MH extending through the stacked body 30 and reaching the source line BSL.

Third Embodiment

Figure 15A:
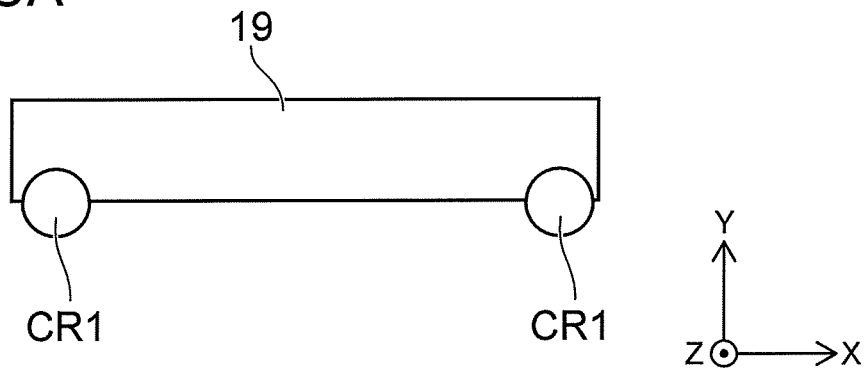
FIGS. 15A to 15C are schematic plan views showing a resistance element according to a third embodiment.
Figure 15B:
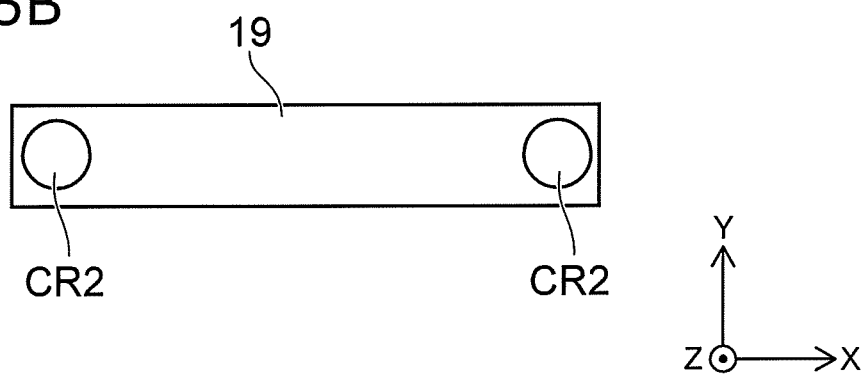
Figure 15C:
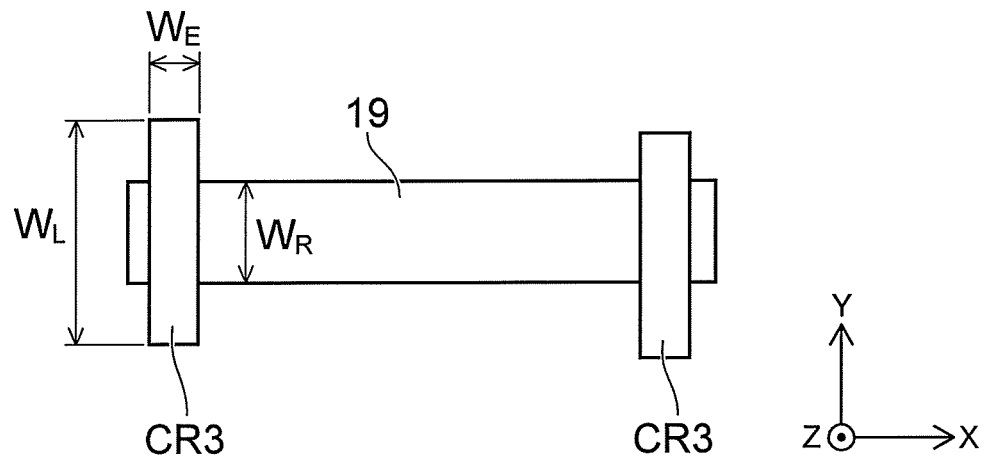

FIGS. 15A to 15C are schematic plan views showing resistance elements according to a third embodiment. FIGS.

15A to 15C are views showing positional relationships between the resistors 19 and the contact plugs CR1, CR2, and CR3.

The contact plugs CR1 shown in FIG. 15A extend downward from above the resistor 19 and are connected respectively to interconnections D2 of the drive circuit CUA (see FIG. 1). The contact plugs CR1 extend through the outer edge of the resistor 19. In other words, the contact plugs CR1 are provided to contact the side surface of the resistor 19, and directly connect the resistor 19 to the interconnections D2.

The contact plugs CR2 shown in FIG. 15B are connected to, for example, the top surface of the resistor 19. The contact plugs CR2 electrically connect the resistor 19 and the interconnections M0 positioned above the resistor 19. In such a case, the resistor 19 is electrically connected to the drive circuit CUA via the contact plugs CR2, the multilayer interconnections ICL, and the contact plugs C3.

The contact plugs CR3 shown in FIG. 15C are embedded, for example, into contact holes having slit configurations. The contact plugs CR3 are provided to contact the top surface of the resistor 19. A width $W_L$ of the contact plug CR3 in a direction (the Y-direction) crossing the extension direction of the resistor 19 (the X-direction) is wider than a width $W_E$ of the contact plug CR3 in the extension direction of the resistor 19. Also, the width $W_L$ of the contact plug CR3 is set to be wider than a width $W_R$ in the Y-direction of the resistor 19.

By using the contact plugs CR3, the contact resistance between the resistor 19 and the contact plugs CR3 can be stabilized. In other words, the contact surface area of the contact plugs CR3 and the resistor 19 is substantially constant when the connection position of the contact plugs CR3 with respect to the resistor 19 varies; and thus, it is possible to suppress the change of the contact resistance therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
   a first conductive layer;
   a second conductive layer provided above the first conductive layer;
   a plurality of electrode layers stacked above the second conductive layer;
   a semiconductor pillar extending through the plurality of electrode layers and the second conductive layer, and connected to the first conductive layer; and
   a third conductive layer provided above the first conductive layer, the third conductive layer being positioned at a level substantially same as a level of the second conductive layer in an extension direction of the semiconductor pillar, and being made of a material same as a material of the second conductive layer, wherein
   the third conductive layer is electrically isolated from the second conductive layer, and is electrically connected to the first conductive layer, and
   the third conductive layer includes a frame portion and a linking portion, the frame portion surrounding the second conductive layer, the linking portion extending in a direction from the frame portion toward the second conductive layer.

2. The device according to claim 1, wherein a portion of the third conductive layer is provided on a side surface of the first conductive layer.

3. The device according to claim 2, wherein
   the first conductive layer is divided into a first region connected to the semiconductor pillar, and a second region other than the first region, and
   the third conductive layer is electrically connected to re second region.

4. The device according to claim 1, wherein the frame portion surrounds the second conductive layer on an inner side of the frame portion.

5. The device according to claim 1, wherein the first conductive layer includes a protruding portion at a position corresponding to the linking portion when viewed from the extension direction of the semiconductor pillar.

6. The device according to claim 1, further comprising:
   a resistor disposed between the second conductive layer and the frame portion of the third conductive layer.

7. The device according to claim 6, wherein the resistor is positioned at a level substantially same as the level of the second conductive layer and the level of the third conductive layer in the extension direction of the semiconductor pillar, and is made of a material same as the materials of the second conductive layer and the third conductive layer.

8. The device according to claim 1, further comprising:
   an inter-layer insulating film provided between the first conductive layer and the second conductive layer and between the first conductive layer and the third conductive layer,
   the inter-layer insulating film having a contact hole at a position between the first conductive layer and the third conductive layer, and
   a portion of the third conductive layer being embedded in the contact hole, and contacting the first conductive layer.

9. The device according to claim 1, wherein the second conductive layer and the third conductive layer include semiconductor.

10. The device according to claim 1, wherein the first conductive layer includes a metal layer and a semiconductor layer formed on the metal layer.

11. A memory device, comprising:
    a circuit including a plurality of circuit elements provided on a substrate;
    a conductive layer provided above the circuit;
    a semiconductor layer provided above the conductive layer;
    a plurality of electrode layers stacked above the semiconductor layer;
    a semiconductor pillar extending through the plurality of electrode layers and the semiconductor layer, and connected to the conductive layer;
    a resistor provided above the circuit and electrically connected to the circuit, the resistor being positioned at a level substantially same as a level of the semiconductor layer in an extension direction of the semiconductor pillar, and being made of a material same as a material of the semiconductor layer;
    a contact plug electrically connecting the resistor and the circuit; and an interconnection positioned between the circuit and the resistor, the interconnection being electrically connected to the circuit element, the contact plug being connected to the resistor and the interconnection.

12. The device according to claim 11, wherein
the resistor has a side surface along the extension direction of the semiconductor pillar, and
the contact plug contacts the side surface of the resistor.

13. A memory device, comprising:
a circuit including a plurality of circuit elements provided on a substrate;
a conductive layer provided above the circuit;
a semiconductor layer provided above the conductive layer;
a plurality of electrode layers stacked above the semiconductor layer;
a semiconductor pillar extending through the plurality of electrode layers and the semiconductor layer, and connected to the conductive layer;
a resistor provided above the circuit and electrically connected to the circuit, the resistor being positioned at a level substantially same as a level of the semiconductor layer in an extension direction of the semiconductor pillar, and being made of a material same as a material of the semiconductor layer;
an interconnection positioned at a level higher than the plurality of electrode layers; and
a contact plug electrically connecting the resistor and the interconnection, the resistor being electrically connected to the circuit via the interconnection.

* * * * *